United States Patent

Nanda et al.

[11] Patent Number: 5,441,616
[45] Date of Patent: * Aug. 15, 1995

[54] INTEGRATED CIRCUIT FABRICATION METHOD

[75] Inventors: Arun K. Nanda, Bethlehem; Mark J. Sundahl, Emmaus; Edward J. Vajda, Allentown, all of Pa.

[73] Assignee: AT&T Corp., Murray Hill, N.J.

[*] Notice: The portion of the term of this patent subsequent to May 17, 2011 has been disclaimed.

[21] Appl. No.: 171,123

[22] Filed: Dec. 21, 1993

Related U.S. Application Data

[62] Division of Ser. No. 991,806, Dec. 16, 1992, Pat. No. 5,312,780.

[51] Int. Cl.$^6$ .................... C23C 14/34; H01L 21/302
[52] U.S. Cl. .................... 204/192.23; 204/192.15; 204/192.28; 437/225; 437/238
[58] Field of Search .......... 204/192.12, 192.23, 204/192.15, 192.26, 192.27, 192.28, 298.25; 437/225, 231

[56] References Cited

U.S. PATENT DOCUMENTS

| | | | |
|---|---|---|---|
| 4,617,192 | 10/1986 | Chin et al. | 427/42 |
| 4,634,474 | 1/1987 | Camlibel et al. | 148/1.5 |
| 4,641,420 | 2/1987 | Lee | 29/511 |
| 4,652,467 | 3/1987 | Brinker et al. | 427/246 |
| 4,722,298 | 2/1988 | Rubin et al. | 204/298.25 X |
| 4,933,304 | 6/1990 | Chen et al. | 437/194 |
| 5,019,234 | 5/1991 | Harper | 204/192 |
| 5,066,615 | 11/1991 | Brady et al. | 437/229 |
| 5,106,786 | 4/1992 | Brady et al. | 437/229 |
| 5,186,718 | 2/1993 | Tepman et al. | 204/298.25 X |
| 5,312,780 | 5/1994 | Nanda et al. | 437/225 |

Primary Examiner—Nam Nguyen
Attorney, Agent, or Firm—John T. Rehberg

[57] ABSTRACT

A method for forming an anti-reflective coating useful in the fabrication of integrated circuits is discussed. Applicants have found that preheating semiconductor wafers prior to the application of amorphous silicon anti-reflective coatings tends to reduce undesirable particulates which may attach to the wafer. The process is illustratively performed in a Varian 3180 machine having four stations. Illustratively, the wafer may be preheated between 70° C. and 175° C. prior to and during the sputter deposition of an amorphous silicon anti-reflective coating.

3 Claims, 1 Drawing Sheet

INTEGRATED CIRCUIT FABRICATION METHOD

This is a division of application Ser. No. 07/991806 filed Dec. 16, 1992, now U.S. Pat. No. 5,312,780.

TECHNICAL FIELD

This invention relates to methods for fabricating semiconductor integrated circuits.

BACKGROUND OF THE INVENTION

Many processes utilized for the fabrication of integrated circuits involve the formation, by sputtering or deposition, of a material layer. A photoresist is spun on top of the material layer and subsequently patterned. The patterned photoresist serves as a mask through which the material layer may be etched using either dry or wet processes.

Anti-reflective coatings (ARC) are often positioned between the material layer and the photoresist. Anti-reflective coatings absorb the light which is used to expose the photoresist and prevent undesired reflections which might inadvertently expose portions of the photoresist which should not be exposed. Amorphous silicon is frequently employed as an anti-reflective coating over materials such as aluminum, spin-on glass, oxides, etc.

SUMMARY OF THE INVENTION

Amorphous silicon anti-reflective coatings are frequently deposited by sputtering utilizing sputtering apparatus such as a Varian 3180 or other machine. Applicants have frequently noticed that after formation of an anti-reflective coating, many small particles having sizes between one-half and two microns may be observed on the wafer. The composition of the particles has not been determined by applicants. It is hypothesized that the particles may be silicon or another material. These excess particles are undesirable because they can cause shorts between runners or may ultimately affect integrated circuit reliability.

The problem of undesirable particles may be alleviated by the present invention which illustratively includes preheating the substrate prior to formation of the anti-reflective coating. Desirably, the substrate is maintained at the same preheat temperature during the process of forming the coating. As explained below, the preheating creates mechanisms which tend to discourage particles from sticking to the wafer.

DETAILED DESCRIPTION

Figure 1:
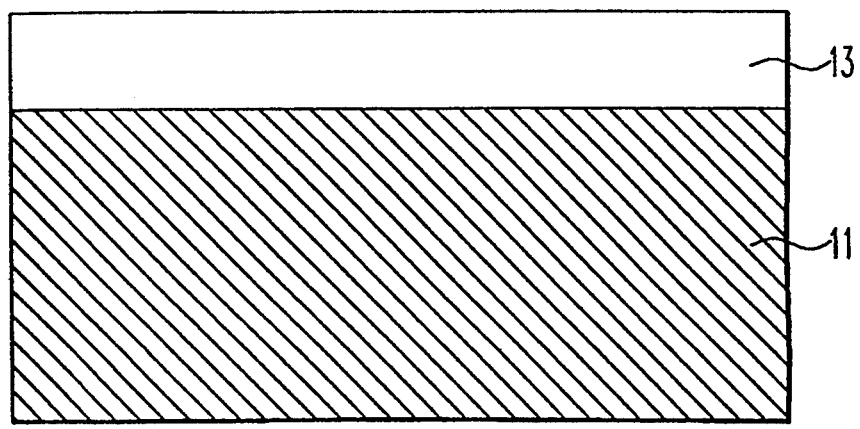
FIG. 1 is a cross-sectional view of a portion of a partially fabricated integrated circuit useful in understanding an illustrative embodiment of the present invention.

In FIG. 1, reference numeral 11 denotes a substrate which may illustratively be aluminum, spin-on glass, or a form of silicon dioxide (for instance, either a thermal oxide or a deposited oxide). In general, the term substrate refers to any material upon which other material layers may be formed.

Reference numeral 13 denotes an anti-reflective coating which is, illustratively, amorphous silicon. Layer 13 has been in the past, typically, formed by sputtering at room temperature in, for example, a Varian 3180 machine.

Applicants have discovered that preheating substrate 11 prior to and during deposition of anti-reflective coating 13 tends to reduce the number of particles upon layer 13.

Figure 2:
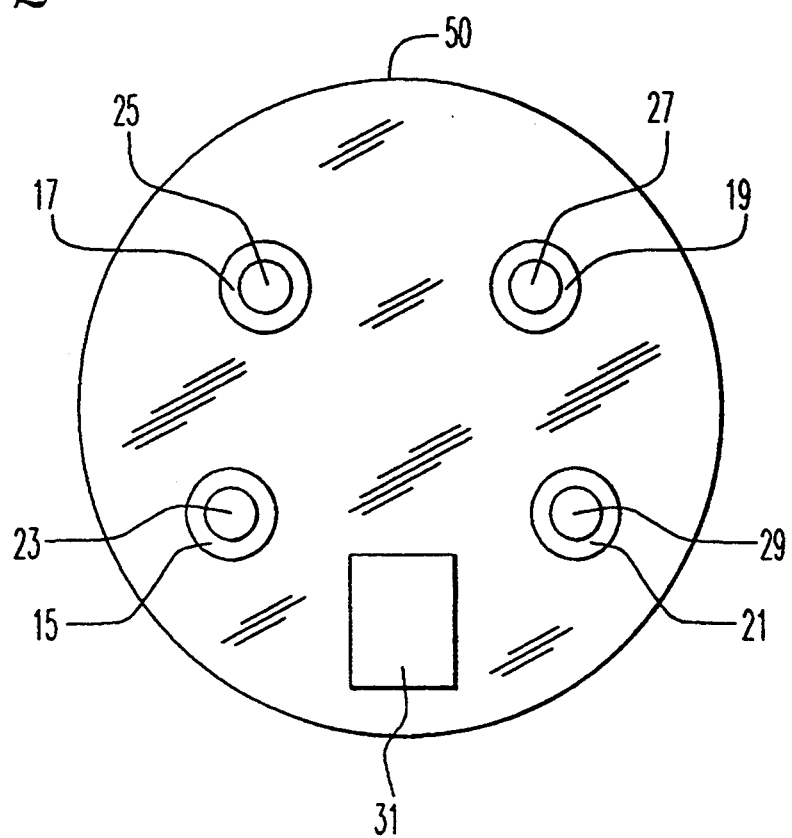
FIG. 2 is a schematic diagram illustrating an apparatus or machine employed in an illustrative embodiment of the present invention.

FIG. 2 is a diagram which schematically represents a Varian 3180 sputter deposition machine 50 commercially available from Varian Associates. Reference numeral 31 denotes a load lock through which wafers enter and leave the machine. Reference numerals 15, 17, 19, and 21 denote each of the four stations typical of the Varian 3180 machine. Reference numerals 23, 25, 27, and 29 represent individual wafers positioned in each of stations 15, 17, 19, and 21, respectively. In one illustrative embodiment of applicants' invention, stations 15, 17, 19, and 21 are each maintained at 175° C.±2° C. Each station 15, 17, 19, and 21 is capable of heating an individual wafer to a predetermined temperature because each station has a heater similar to a hot plate to which the wafer is clamped by wafer clips. Sputter deposition of an anti-reflective coating of amorphous silicon (similar to reference numeral 13 of FIG. 1) is performed at station 21 upon wafer 29. However, wafer 29 has been preheated to 175° C. by its passage through each of stations 15, 17, and 19, respectively. Of course, as is typical production practice, after sputtering of an anti-reflective coating is completed upon wafer 29, wafer 29 is removed via loadlock 31, and wafer 27 proceeds to station 21 where deposition commences upon wafer 27. Wafer 27 has, of course, been preheated to approximately 175° C.

As mentioned before, sputter deposition of an amorphous silicon anti-reflective coating is ordinarily performed at room temperature. (Deposition of other silicon layers, for example, gate polysilicon, may be performed upon the preheated wafers because there is concern about the mechanics of grain growth. But, typically, those who form anti-reflective coatings have no interest in grain size and consequently sputter at room temperature.)

Applicants hypothesize that preheating of wafers such as wafer 29 before sputter deposition prevents the deposition of particles upon anti-reflective coating 13 because the preheating in the Varian machine may establish convection currents around the wafer which tend to carry particles away from it. Furthermore, the comparatively cold particles present in the ambient environment of machine 50 tend to attach to colder surfaces, rather than to the preheated wafer surfaces. Furthermore, applicants believe that a thermophoresis phenomenon is also partially responsible for preventing particles from clinging to the wafer surfaces. Applicants believe that the particles may be heated during the sputter deposition process in such a way that only one side of the particle has a higher temperature than the other. An instability results in which the particles oscillate and tend to be sucked into the system vacuum pump rather than settling upon the heated wafer.

In the embodiment discussed above, wafer 29 is originally introduced via load lock 31 to heated station 15. Wafer 29 already has a layer of aluminum or spin-on glass or an oxide formed upon it.

In another embodiment of the present invention, aluminum may be deposited upon wafers in machine 50 at a station such as station 17, and an anti-reflective coating may be deposited upon the wafers at a station such as station 21. In this embodiment, a wafer is introduced via load lock 31. The wafer may or may not be preheated at station 15. When the wafer is introduced to station 17, aluminum deposition at temperatures near 300° C. is performed. After deposition, the wafer moves to station 19 where it is heated to a temperature of approximately 70° C.±2° C. After the wafer reaches thermal equilibrium, it is transferred to station 21 where an anti-reflective coating is deposited by sputter deposition at a temperature of 70° C.±2° C. A temperature of 70° C. (lower than the preheat temperature of 175° C. discussed in the embodiment above) is utilized to avoid the possibility of the amorphous silicon anti-reflective coating 13 spiking into the underlying aluminum substrate. The lower preheat temperature is believed to retard such spiking.

In general, the temperature range between 175° C. and 70° C. has been found to produce satisfactory results.

We claim:

1. A method of integrated circuit fabrication comprising: introducing a silicon semiconductor wafer into a multi-chamber machine;

forming a material layer overlying said wafer in a first chamber, said material being chosen from the group consisting of aluminum, spin-on glass, silicon dioxide;

moving said wafer to a second chamber maintained at a constant temperature;

allowing said wafer to come to thermal equilibrium in said second chamber;

moving said wafer to third chamber, said third chamber being maintained at the same said constant temperature as the said second chamber;

depositing an anti-reflective coating upon said layer of material by sputter deposition in said third chamber.

2. The method of claim 1 in which said constant temperature is 70° C.±2° C.

3. The method of claim 1 in which said constant temperature is 175°±2° C.

* * * * *